United States Patent
Ong et al.

(10) Patent No.: US 6,426,460 B1
(45) Date of Patent: Jul. 30, 2002

(54) VELCRO STRAPPING FOR SEMICONDUCTOR CARRYING TRAYS

(75) Inventors: Kester Ong; Francis Chang; Chee Keong Tan, all of Singapore (SG)

(73) Assignee: St Assembly Test Services Pte Ltd, Singapore (SG)

( * ) Notice: Subject to any disclaimer, the term of this patent is extended or adjusted under 35 U.S.C. 154(b) by 0 days.

(21) Appl. No.: 09/713,800

(22) Filed: Nov. 16, 2000

Related U.S. Application Data

(62) Division of application No. 09/307,838, filed on May 10, 1999, now Pat. No. 6,176,066.

(51) Int. Cl.[7] ............................. H05K 7/00; H05K 9/00
(52) U.S. Cl. ................ 174/52.1; 174/35 R; 361/729; 361/735
(58) Field of Search .................. 174/52.1, 35 R, 174/35 MS; 361/679, 728, 729, 732, 735, 736, 737, 740, 784, 790, 816, 818; 24/302, 31 V; 224/620, 658, 901.2; 248/205.2

(56) References Cited

U.S. PATENT DOCUMENTS

| | | | |
|---|---|---|---|
| 4,471,872 A | | 9/1984 | Dedow ........................ 206/328 |
| 4,596,053 A | * | 6/1986 | Cohen et al. ....................... 2/1 |
| 4,677,521 A | * | 6/1987 | Frazier ......................... 361/220 |
| 4,730,625 A | | 3/1988 | Fraser et al. ................. 128/781 |
| 4,755,144 A | * | 7/1988 | Gordon et al. ................. 439/37 |
| 5,203,452 A | * | 4/1993 | Small et al. .................. 206/329 |
| 5,676,178 A | * | 10/1997 | Ehnimb ................... 138/384 R |
| 6,076,789 A | * | 6/2000 | Jackson .................... 248/205.2 |

* cited by examiner

*Primary Examiner*—Dean A. Reichard
*Assistant Examiner*—Carmelo Oliva
(74) *Attorney, Agent, or Firm*—George O. Saile; Stephen B. Ackerman

(57) ABSTRACT

An antistatic strapping apparatus for binding and securing a plurality of semiconductor device carrier trays, the apparatus including a strap member having opposed ends and a side defined as a top side spaced from a side defined as a bottom side and a major surface defined by the opposed ends and top and bottom sides. A loop portion of a hook and loop fastening combination constitutes the major surface area on the top side of the strap member. A piece of hook portion having the same width as the strap member of the book and loop fastening combination secured to the top side at a first end of the strap member, the hook portion extending the length of the strap member by at least about 80 mm. A conductive thread is sewn in a multiplicity of lengthwise tracks on the second side of the major surface to prevent build-up of static electricity. A "L" shaped buckle having a first transverse slot formed therethrough and near the end of the shorter leg, and a second transverse slot formed therethrough and near the end of the longer leg. The second end of the strap member is inserted through first slot of the "L" shaped buckle and folded back to itself, the bottom surface contain conductive thread tracks facing out, is sewn to secure the second end to the "L" shaped buckle.

9 Claims, 6 Drawing Sheets

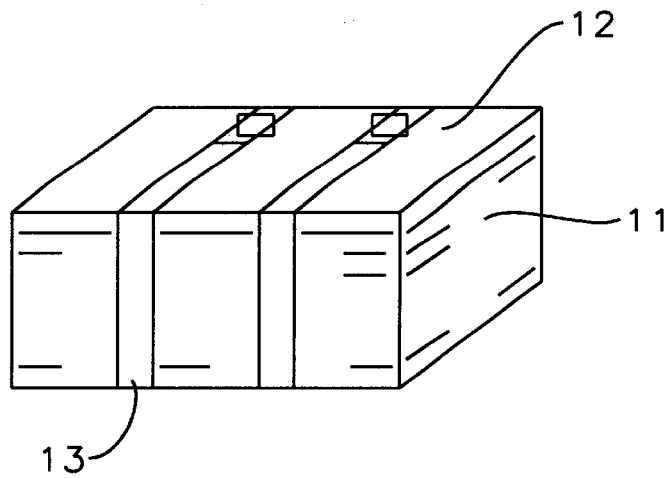
FIG. 1 - Prior Art
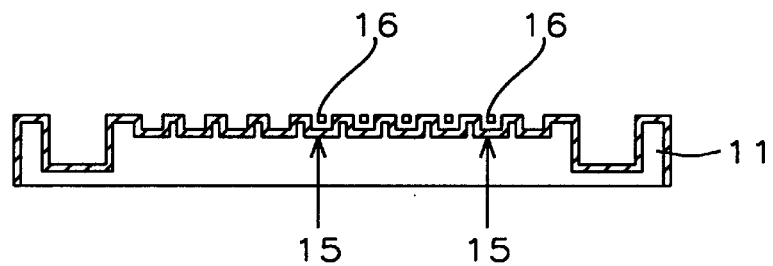
FIG. 2
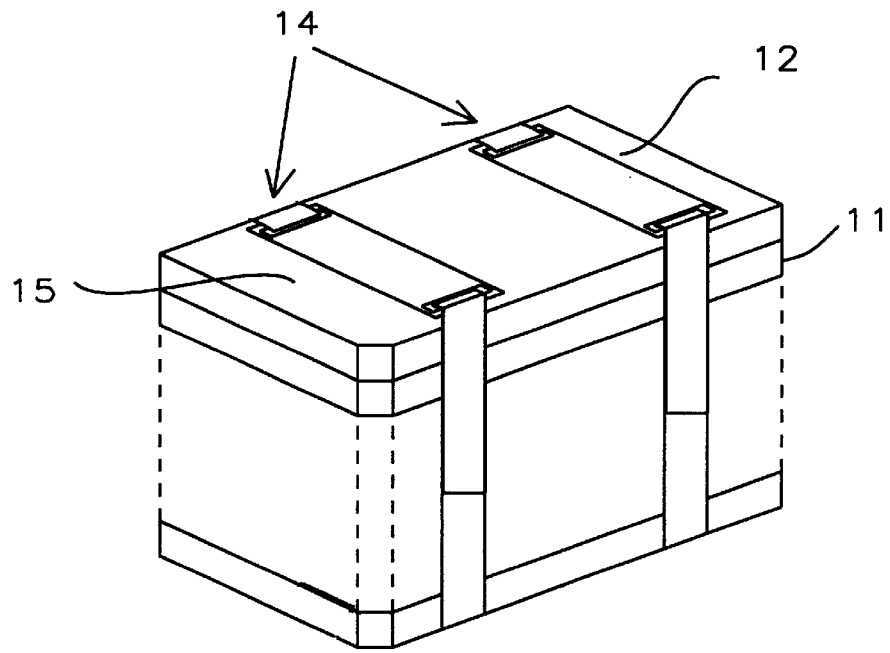
FIG. 3

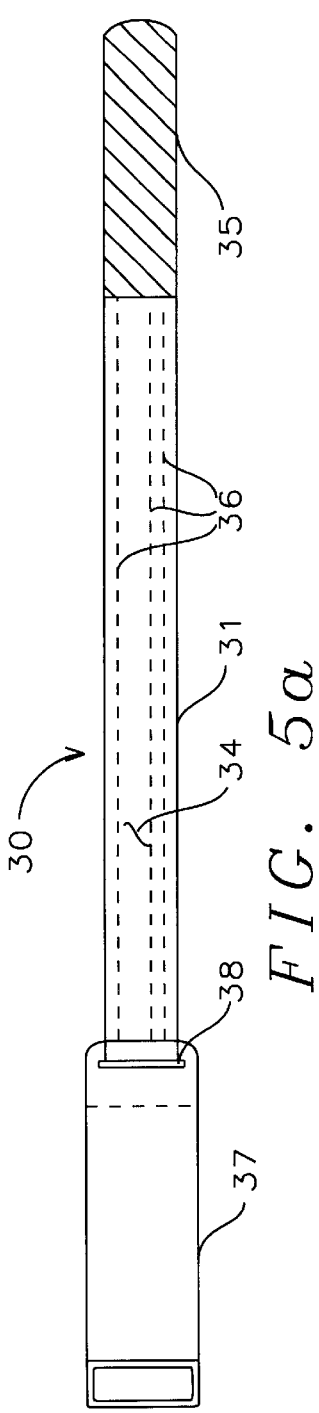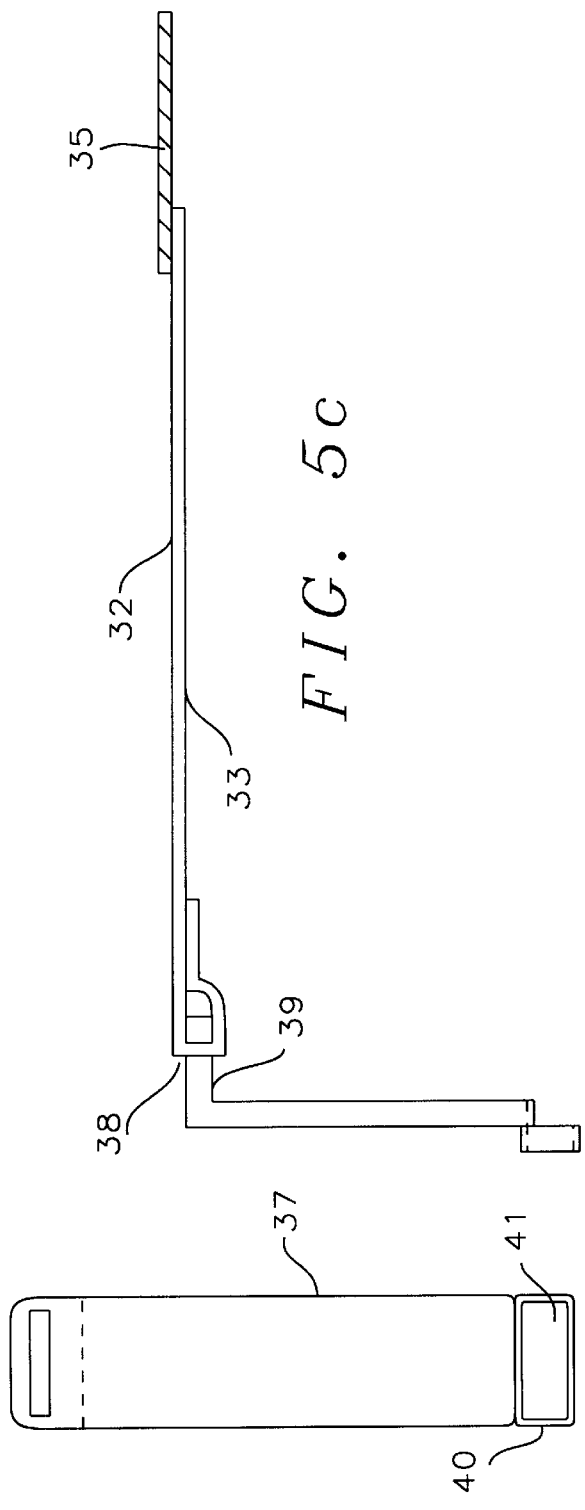

VELCRO STRAPPING FOR SEMICONDUCTOR CARRYING TRAYS

This is a division of patent application Ser. No. 09/307,838, filing date May 10, 1999, Now U.S. Pat. No. 6,176,066 Velcro Strapping For Semiconductor Carrying Trays, assigned to the same assignee as the present invention.

BACKGROUND OF THE INVENTION (1) Technical Field

This invention relates generally to packaging systems for semiconductor integrated circuits, and more particularly, to a novel, reusable, antistatic strapping method for securing stacks of trays containing arrays of semiconductor devices during testing operations, and which also allows for writing lot identification information directly onto the straps.

(2) Description of the Prior Art

In view of the trend for higher and higher packing densities for semiconductor integrated circuits or chips, electronic manufacturers have developed, in recent years, extremely miniaturized rectangular-shaped parts of the type having no terminal leads, such as pin grid array packages. Some of these types of pin grid array package structures are formed with solder balls on their bottom surface rather than with external terminal pins and are referred to as "ball grid arrays" (BGA) packages. Over the years, BGA packages of this type have become even smaller with extraordinary small outer dimensions and are sometimes referred to as "micro ball grid arrays," or micro BGA packages. For example, a typical micro BGA package having forty-four solder balls on its bottom surface may have a length dimension of about 11 mm, a width dimension of about 6 mm and a thickness of about 2 mm.

During the manufacturing of semiconductor device packages, these packages are stored and transported to and from various types of processes or manufacturing equipment for carrying out different manufacturing or assembling steps. For example, the semiconductor device packages may be assembled, marked, tested, inspected and the like during which time the packages are handled and transported between the various manufacturing processes and/or machines. Further, after the processing steps have been completed, the semiconductor device packages are also packed and transported from a chip manufacturer's site to an assembly station at a customer's site where further assembly or testing operations are performed.

Heretofore, there is known in the prior art of a chip carrier tray having a plurality of separate compartments or pockets for accommodating a number of individual semiconductor device packages spaced apart from each other. Such a prior art chip carrier tray with a cover is illustrated in FIG. 1 The chip carrier tray 11 and the cover 12 are both formed of a general square-shaped configuration. FIG. 2 shows a cross-sectional view of the tray 11 which includes a plurality of separate compartments 15 each being capable of holding therein a single semiconductor device package 10.

Conventionally, chip carrier trays are transported between manufacturing sites and processes in stacks of up to (and about) ten trays. The trays are banded together using antistatic strapping material 13 and are securely sealed by heat activation. The straps 13 must be cut and discarded at each manufacturing or processing stage. The restrapping process requires that many strapping machines be maintained in every corner of the test floor to minimize the transportation distance of unstrapped trays. In addition, the strapping material itself must be replaced at each step, a costly proposition for the manufacturer and/or end user.

SUMMARY OF THE INVENTION

The objective of this invention relates directly to an effective and cost-saving means of securing trays containing semiconductor device packages during transport between testing and other operations.

The main object of the invention is to allow for the transport of these trays efficiently and safely to minimize yield losses due to mechanical failure. This method ensures that trays can be secured immediately after testing, reducing Bend lead problems.

Another object of the invention is to utilize VELCRO, a hook and loop fastener, for strapping material, which is recyclable to secure the trays rather than employ one-time-use strapping materials which must be cut and replaced at each testing or manufacturing stage.

Yet another object of this invention is to eliminate the need for heat activation of the strapping which has been the conventional approach to securing the trays. The re-useable hook and loop strapping material allows the trays to be secured without heat activation and without the heat activation machinery intrinsic to the process.

Yet another object of the invention is to save money by reducing the need for strapping machines on each test floor, as well as reduce costs of the strapping material needed. In the past, the strapping material had to be replaced at every manufacturing or testing step when the strap was cut to allow the semiconductor device packages to be removed. With this invention's use of, a hook and loop fastener, the straps can be opened without cutting and replaced without heat activation and are, therefore, many times recyclable and reusable.

Still another object of this invention is to provide a neat and practical material handling on the test floor eliminating the need for multiple strapping machines and excessive strapping material use and to provide an easy means of identification of the tray lot. Lot identification (ID) can be written on the Velcro straps with a magic marker.

In accordance with the objectives of the invention, a method for safely securing a stack of trays containing semiconductor devices is achieved. An antistatic strapping apparatus for binding and securing a plurality of semiconductor device carrier trays, the apparatus including a strap member having opposed ends and a side defined as a top side spaced from a side defined as a bottom side and a major surface defined by the opposed ends and top and bottom sides. A loop portion of a hook and loop fastening combination constitutes the major surface area on the top side of the strap member. A piece of hook portion having the same width as the strap member of the hook and loop fastening combination secured to the top side at a first end of the strap member, the hook portion extending the length of said strap member by at least about 80 mm. A conductive thread is sewn in a multiplicity of lengthwise tracks on said second side of said major surface to prevent build-up of static electricity. A "L" shaped buckle having a first transverse slot formed therethrough and near the end of the longer leg, and a second transverse slot formed therethrough and near the end of the shorter leg. The second end of the strap member is inserted through first slot of the "L" shaped buckle and folded back to itself, the bottom surface contain conductive thread tracks facing out, is sewn to secure the second end to the "L" shaped buckle.

DESCRIPTION OF THE DRAWINGS

FIG. 1 is an isometric view of a strapped tray arrangement of the prior art.

FIG. 2 is a cross-sectional view of a device tray of the prior art.

FIG. 3 is an isometric view of a strapped tray arrangement of the invention.

FIGS. 5a, 5b, and 5c are orthographic views of the invention, showing the top, end and side views of the hook and loop fastener strap.

DETAILED DESCRIPTION OF THE PREFERRED EMBODIMENT

Referring to FIGS. 2 and 3, this invention relates to handling of semiconductor device packages, and particularly, to a novel, reusable, antistatic strapping method for securing a stack of stackable trays 11 containing semiconductor device packages 16 held in pocket cavities 15. These packages are stored and transported to and from various types of processes or manufacturing operations for carrying out different manufacturing or assembling steps, for example, the device packages 16 may be assembled, marked, tested, inspected and the like during which time the device packages are handled and transported between various manufacturing processes and/or machines. Further, after the processing steps have been completed, the semiconductor device packages are also packed and transported from a chip manufacturer's site to an assembly station at a customer's site where further assembly or testing is performed.

FIG. 3 is a schematic drawing of the preferred method showing the unique use of the hook and loop fastener straps 14 for securing up to a maximum of ten trays 11 during handling and transport within the manufacturing facility or at the customer's testing facility.

Figure 4A:
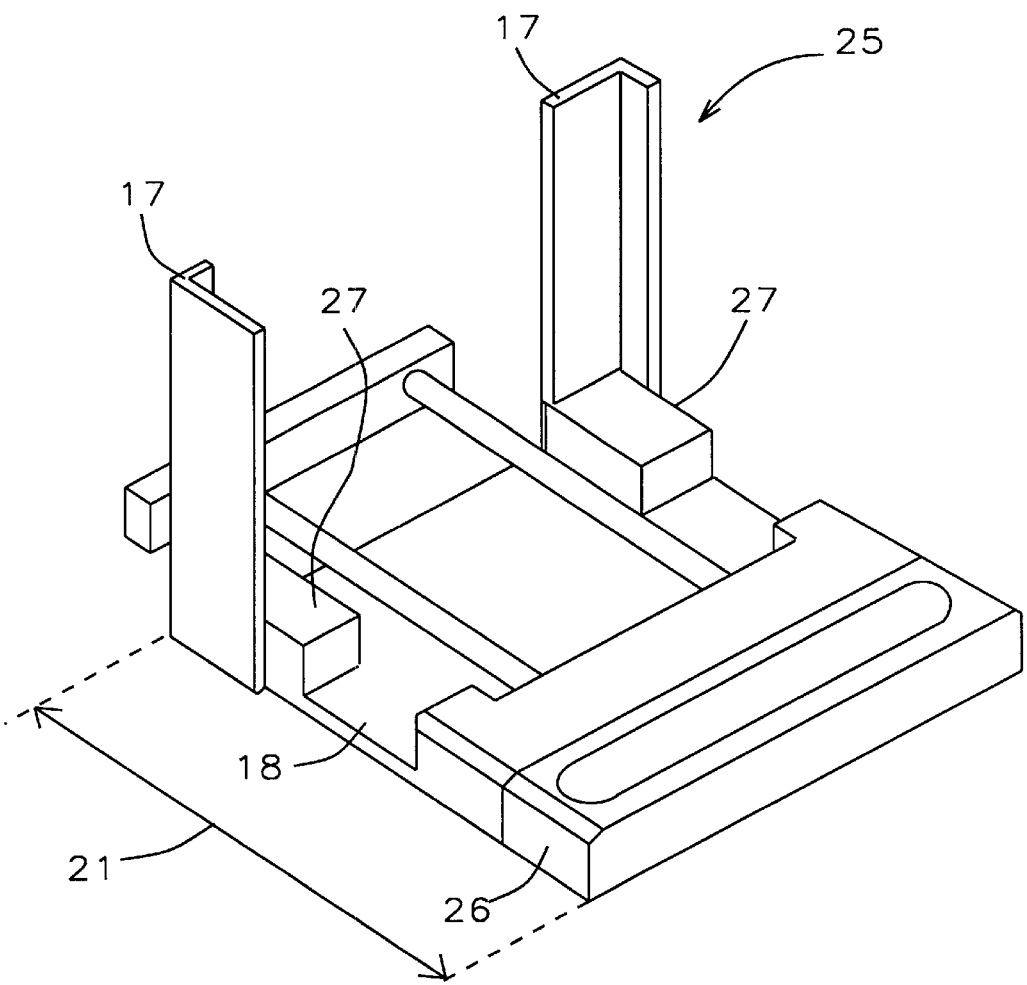
FIGS. 4A and 4B are isometric views of a strapping jig of the invention.
Figure 4B:
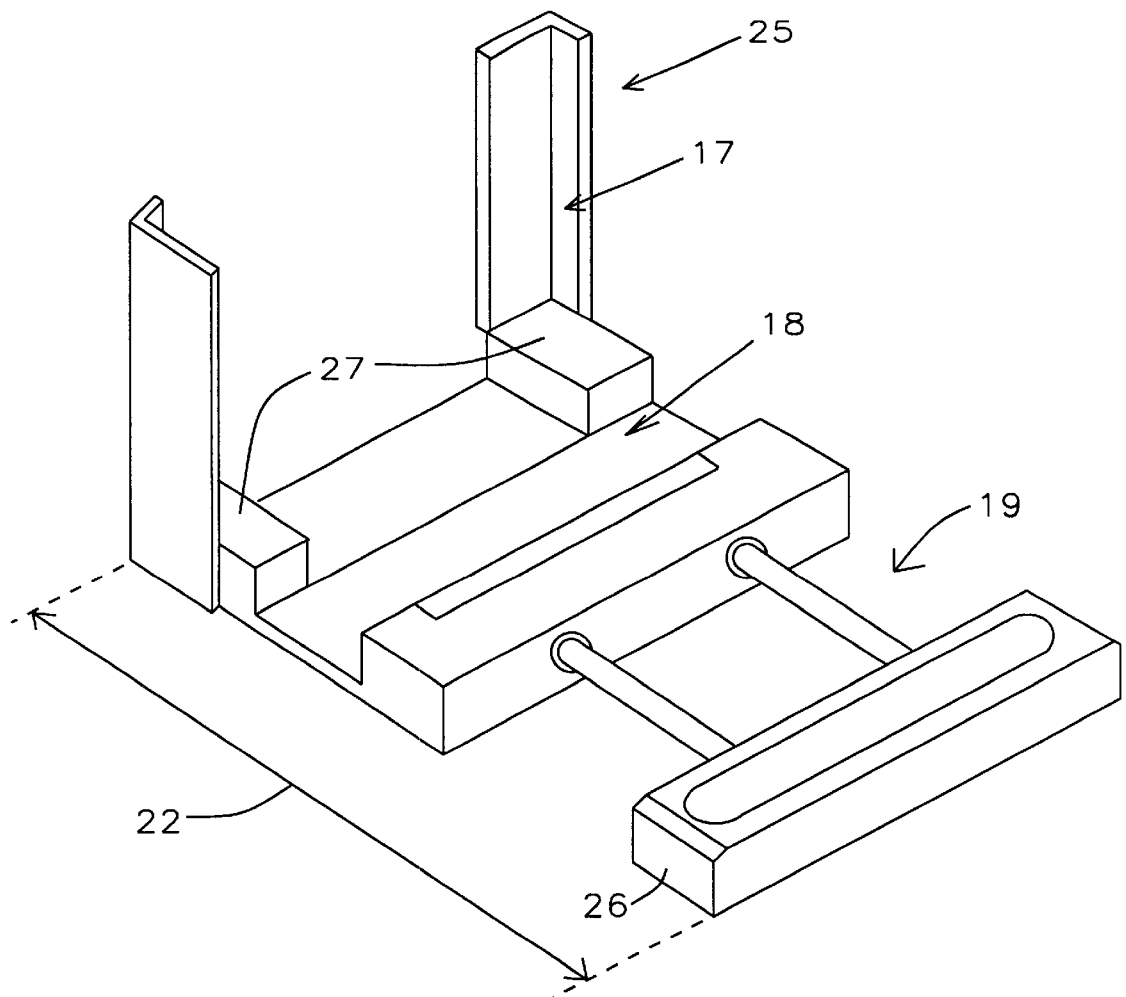

FIGS. 4A and 4B are isometric views of a strappingjig 25 used for strapping a stack of trays. FIG. 4A illustrates the jig in a retracted position 21, FIG. 4B in an extended position 22. The extended position 22 is adjustable, in and out, to accommodate various tray sizes. Tray guides 17 help guide the trays for stacking and placing on rest pads 27 that support one end of the tray stack while the other end is supported by the adjustable support member 26. The strapping jig 25, therefore, is designed for manually guiding and stacking, up to ten trays, and banding the stack with the hook and loop fastener straps placed, accessibly, within runways 18 and 19 to facilitate wrapping and securing both ends of the tray stack.

FIGS. 5a, 5b and 5c show the orthogonal projections of the hook and loop fastener strap and buckle assembly 30. The strap member 31 having opposed ends and a side defined as a top side 32 spaced from a side defined as a bottom side 33 and a major surface defined by the opposed ends and top and bottom sides. A loop portion 34 of the hook and loop fastener combination constitutes the major surface area on the top side of the strap member 31. A piece of hook portion 35 having the same width as the strap member is secured to the top side 32 at a first end of the strap member. The hook portion 35 extends the length of the strap member by at least about eighty millimeters. A conductive thread is sewn in a multiplicity of lengthwise tracks 36 on the second side 33 of the major surface to prevent build-up of static electricity. A L-shaped buckle 37 having a first transverse slot 38 formed therethrough and near the end of the shorter leg 39, and a second opening 41 forming a shortened tubular member 40 that is bonded by welding to the distal end of the longer leg of L-shaped buckle 37. The second end of the strap member is inserted through the first transverse slot 38 of the L-shaped buckle 37 and folded back to itself with the bottom surface, containing the conductive thread tracks, facing out, is sewn to secure the second end to the L-shaped buckle 37. The L-shaped buckle 37 provides a fulcrum support during tightening of the hook and loop fastener strap 30. The L-shaped buckle permits easy identification of lots as the flat area of the buckle can be written on directly with a magic marker.

Figure 6:
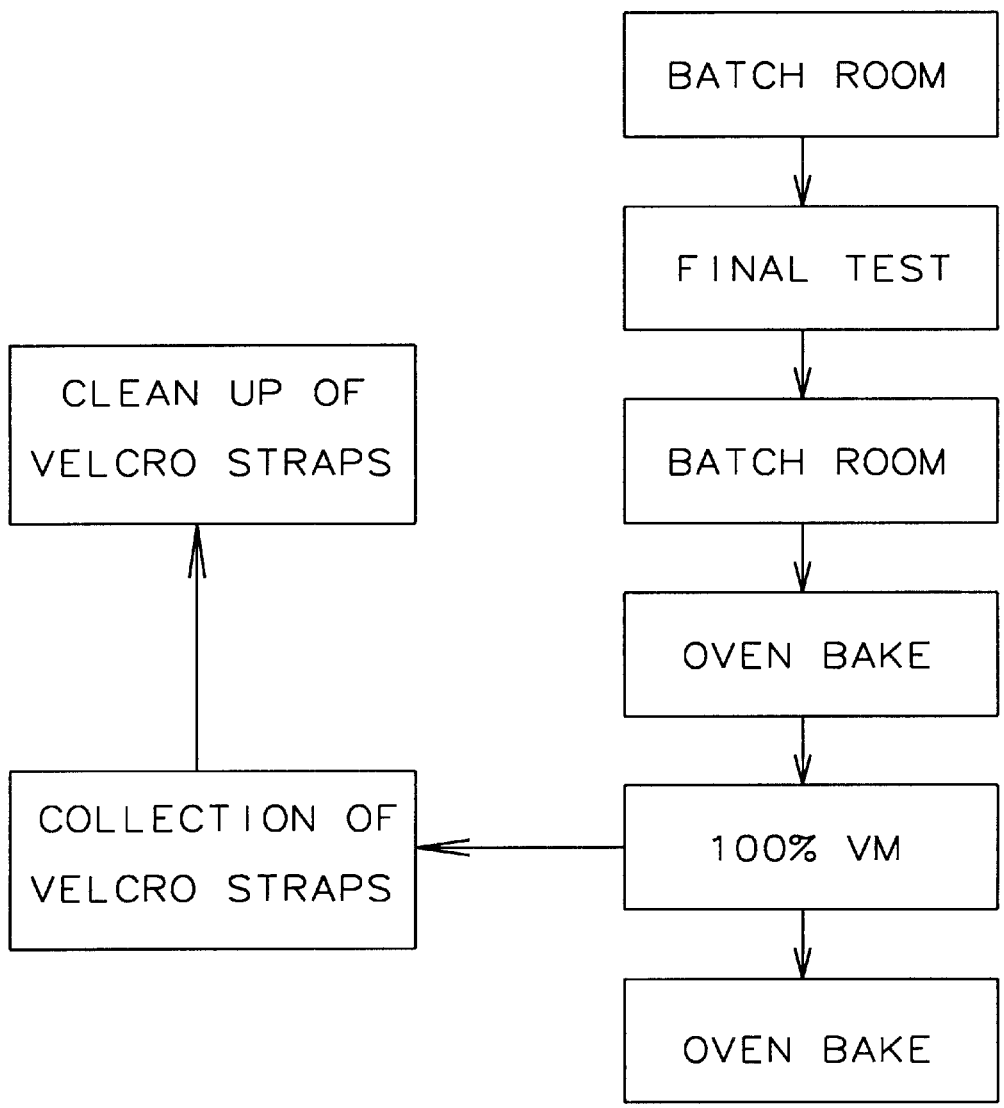
FIG. 6 is a flow chart, of the invention, depicting the reusable nature of the hook and loop fastener strap and the cleaning and recycling of the straps during normal production.

FIG. 6 is a flow chart which explains the reusable nature of the hook and loop fastener strapping and the cleaning and recycling of the straps during normal production. After count verification, the Pre-Test group will prepare the lot using the hook and loop fastener strap. Final test will re-strap the lot. Baking can be done with the hook and loop fastener straps in place. After completing the 100% VM, the Manufacturing Specialist will remove the hook and loop fastener strap and replace it with a polypropylene strap for final pack prior to customer shipping. At the end of the normal production run, the hook and loop fastener strap will be cleaned and returned to the pre-test area for recycling and reuse.

Figure 7:
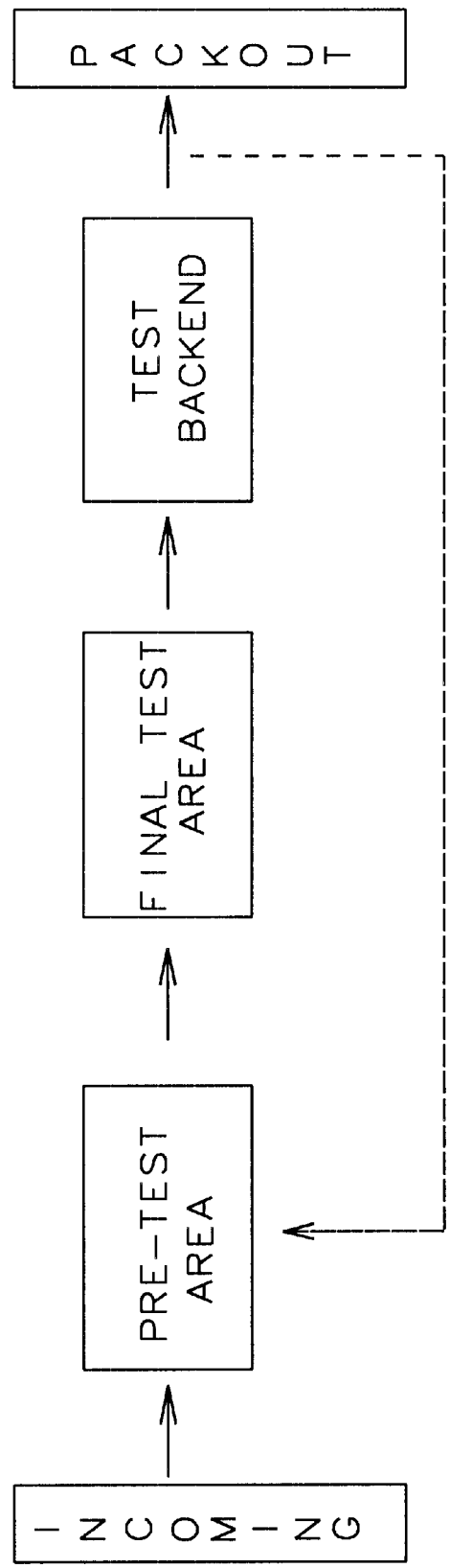
FIG. 7 is another flow chart, of the invention, representing the extended scope of the hook and loop fastener strap usage to cover materials coming from the assembly area to the test floor.

FIG. 7 is another flow chart which explains the extended scope of the Velcro strap usage to cover materials coming from STATS assembly area to the test floor. The trays remain held in place by the Velcro straps during both pretest and final test eliminating movement of Bin 1 trays from handler to strapping machines locations. Trays can be secured immediately after testing, thereby reducing bent lead problems and saving both material costs and equipment running costs by using Velcro straps instead of heat-activated polypropylene. After each round of production, the Velcro straps are cleaned and returned to the Pre-Test area for reuse and recycling.

FIG. 7 is another flow chart which explains the extended scope of the hook and loop fastener strap usage to cover materials coming from STATS assembly area to the test floor. The trays remain held in place by the hook and loop fastener straps during both pretest and final test eliminating movement of Bin 1 trays from handler to strapping machines locations. Trays can be secured immediately after testing, thereby reducing bent lead problems and saving both material costs and equipment running costs by using the hook and loop fastener straps instead of heat-activated polypropylene. After each round of production, the hook and loop fastener straps are cleaned and returned to the Pre-Test area for reuse and recycling.

What is claimed is:

1. An apparatus for securing a stack of at least one container, the apparatus comprising:

pair of antistactic strap members for protecting a multiplicity of semiconductor devices contained within said container;

an antistactic strap member having opposed ends and a side defined as a top side spaced from a side defined as a bottom side and a major surface defined by the opposed ends and top and bottom sides;

a loop portions of a hook and loop fastening combination constitutes the major surface on the top side of the strap member;

a piece of hook portion having the same width as said strap member of said hook and loop fastening combination is secured to the top side at a first end said strap member, said hook portion extending the length of said strap member by at least about 80 mm;

a conductive thread is sewn in a multiplicity of lengthwise tracks on said bottom side of said major surface to prevent build-up of static electricity;

a "L" shaped buckle having a first transverse slot formed therethrough and near the end of the shorter leg, and a second transverse opening formed therethrough and affixed near the end of the longer leg, wherein a measured length of the second end of said strap member is inserted through the first slot of said "L" shaped buckle and folded back to itself so that said bottom side containing said conductive thread tracks are facing outward, said measured length is sewn to secure said second end to said "L" shaped buckle.

2. The apparatus of claim 1 wherein the strap member has a strap width defined between the side edges of at least about 20 mm.

3. The apparatus of claim 1 wherein the strap member has a strap length defined between the opposed ends of at least about 300 mm.

4. The apparatus of claim 1 wherein the "L" shaped buckle has a width defined between the side edges of at least about 27 mm and a thickness of at least about 1.2 mm.

5. The apparatus of claim 1 wherein the "L" shaped buckle material is stainless steel having a length defined between the ends of at least about 142 cm.

6. The apparatus of claim 1 wherein the traverse slots in said "L" shaped buckle have a length defined between the slot's ends of at least about 2.2 centimeters.

7. The apparatus of claim 1 wherein the hook portion secured to the top side of the strap member is placed overlapping the first end by at least about 20 mm.

8. The apparatus of claim 1 wherein the piece of hook portion is fastened to the top surface of the strap member by means selected from the group including sewing, heat sealing, and riveting.

9. The apparatus of claim 1 wherein said strap member is a conductive antistatic hook and loop fastening combination.

* * * * *